United States Patent
Andreyushchenko et al.

(10) Patent No.: US 7,476,974 B2
(45) Date of Patent: Jan. 13, 2009

(54) METHOD TO FABRICATE INTERCONNECT STRUCTURES

(75) Inventors: Tatyana N. Andreyushchenko, Portland, OR (US); Kenneth Cadien, Portland, OR (US); Paul Fischer, Portland, OR (US); Valery M. Dubin, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 297 days.

(21) Appl. No.: 11/407,550

(22) Filed: Apr. 19, 2006

(65) Prior Publication Data

US 2006/0202342 A1    Sep. 14, 2006

Related U.S. Application Data

(62) Division of application No. 10/748,106, filed on Dec. 24, 2003, now Pat. No. 7,087,517.

(51) Int. Cl.
*H01L 23/52* (2006.01)
*H01L 23/48* (2006.01)
*H01L 23/40* (2006.01)
*H01L 21/4763* (2006.01)
*H01L 21/44* (2006.01)

(52) U.S. Cl. .................... 257/774; 257/775; 438/627; 438/637; 438/638; 438/666; 438/667; 438/668; 438/672

(58) Field of Classification Search .............. 257/774, 257/775; 438/627, 637, 638, 666, 667, 668, 438/672
See application file for complete search history.

(56) References Cited

U.S. PATENT DOCUMENTS

| | | | |
|---|---|---|---|
| 6,008,127 A | 12/1999 | Yamada | |
| 6,150,269 A | 11/2000 | Roy | |
| 6,156,606 A | 12/2000 | Michaelis | |
| 6,225,210 B1 | 5/2001 | Ngo et al. | |
| 6,524,867 B2 | 2/2003 | Yang et al. | |
| 6,534,117 B1 | 3/2003 | Yoshio et al. | |
| 6,670,274 B1 * | 12/2003 | Liu et al. | 438/692 |

(Continued)

OTHER PUBLICATIONS

"International search report and the written opinion of the international searching authority, or the declaration," PCT/US2004/043234, May 6, 2005.

*Primary Examiner*—Luan Thai
(74) *Attorney, Agent, or Firm*—Blakely, Sokoloff, Taylor & Zafman LLP

(57) ABSTRACT

A method includes forming a barrier layer on a substrate surface including at least one contact opening; forming an interconnect in the contact opening; and reducing the electrical conductivity of the barrier layer. A method including forming a barrier layer on a substrate surface including a dielectric layer and a contact opening, depositing a conductive material in the contact opening, removing the conductive material sufficient to expose the barrier layer on the substrate surface, and reducing the electrical conductivity of the barrier layer. An apparatus including a circuit substrate including at least one active layer including at least one contact point, a dielectric layer on the at least one active layer, a barrier layer on a surface of the dielectric layer, a portion of the barrier layer having been transformed from a first electrical conductivity to a second different and reduced electrical conductivity, and an interconnect coupled to the at least one contact point.

12 Claims, 2 Drawing Sheets

U.S. PATENT DOCUMENTS

| | | |
|---|---|---|
| 6,806,192 B2 | 10/2004 | Lin et al. |
| 7,205,233 B2 * | 4/2007 | Lopatin et al. .............. 438/678 |
| 7,338,908 B1 * | 3/2008 | Koos et al. .................. 438/745 |
| 2003/0119317 A1 | 6/2003 | Nogami et al. |
| 2003/0227091 A1 * | 12/2003 | Sinha et al. ................. 257/762 |

\* cited by examiner

METHOD TO FABRICATE INTERCONNECT STRUCTURES

CROSS-REFERENCE TO RELATED APPLICATION

This application is a divisional of U.S. patent application Ser. No. 10/748,106, filed Dec. 24, 2003 now U.S. Pat. No. 7,087,517.

BACKGROUND

1. Field

Circuit structures.

2. Relevant Art

Integrated circuits typically use conductive interconnections to connect individual devices on a chip or to send or receive signals external to the chip. A currently popular choice of interconnection material for such interconnections is a copper or copper alloy material.

One process used to form interconnections, particularly copper (alloy) interconnections, is a damascene process. In a damascene process, a trench is cut in a dielectric and filled with copper to form the interconnection. A via may be in the dielectric beneath the trench with a conductive material in the via to connect the interconnection to underlying integrated circuit devices or underlying interconnections. In one damascene process (a "dual damascene process"), the trench and via are each filled with copper material, by, for example, a single deposition.

A photoresist is typically used over the dielectric to pattern a via or a trench or both in the dielectric for the interconnection. After patterning, the photoresist is removed. The photoresist is typically removed by oxygen plasma (oxygen ashing). The oxygen used in the oxygen ashing can react with an underlying copper interconnection and oxidize the interconnection. Accordingly, damascene processes typically employ a barrier layer of silicon nitride ($Si_3N_4$) directly over the copper interconnection to protect the copper from oxidation during oxygen ashing in the formation of a subsequent level interconnection. In interlayer interconnection levels (e.g., beyond a first level over a device substrate), the barrier layer also protects against misguided or unlanded vias extending to an underlying dielectric layer or level (e.g. the barrier layer serves as an etch stop)

In general, the $Si_3N_4$ barrier layer is very thin, for example, roughly 10 percent of the thickness of an interlayer dielectric (ILD) layer. A thin barrier layer is preferred primarily because $Si_3N_4$ has a relatively high dielectric constant (k) on the order of 6 to 7. The dielectric constant of a dielectric material, such as an interlayer dielectric, generally describes the parasitic capacitance of the material. As the parasitic capacitance is reduced, the cross talk (e.g., the characterization of the electric field between adjacent interconnections) is reduced as is the resistance-capacitance (RC) time delay and power consumption. Thus, the effective dielectric constant ($k_{eff}$) of an ILD layer is defined by the thin barrier layer and another dielectric material having a lower dielectric constant so that the effect of the dielectric material typically used for the barrier layer (e.g., $Si_3N_4$) is minimized.

In prior art integrated circuit structures, a popular dielectric material for use in combination with a barrier layer to form ILD layers was silicon dioxide ($SiO_2$). Currently, efforts have focused at minimizing the effective dielectric constant of an ILD layer so materials having a dielectric constant lower than $SiO_2$ have garnered significant consideration. Many of these materials, such as carbon doped oxide (CDO), are porous. The dielectric constant of a dielectric material can be substantially effected by water or liquid absorbed in the pores of the dielectric material.

A typical part of a damascene process to form an interconnection in an ILD layer is a planarization after a deposition of the interconnect material. A typical planarization is a chemical mechanical polish (CMP). A CMP is a wet process that can introduce water or other liquid into a porous dielectric material. In addition, it can add mechanical stress to a dielectric layer. Stress can damage a dielectric layer and effect circuit performance.

BRIEF DESCRIPTION OF THE DRAWINGS

The features of the described embodiments are specifically set forth in the appended claims. Referring to the following description and accompanying drawings, in which similar parts are identified by like reference numerals, best understand the embodiments.

DETAILED DESCRIPTION

Figure 1:
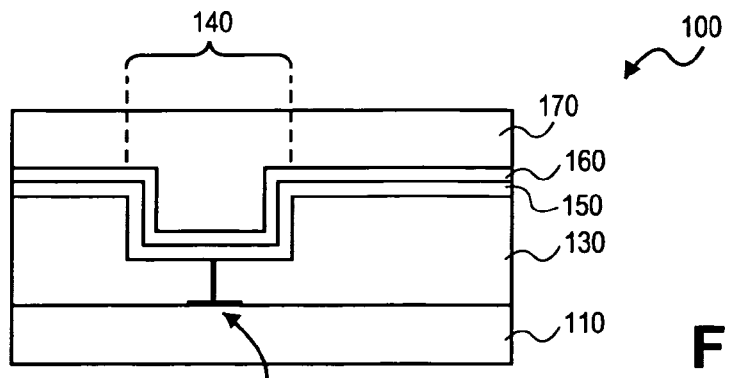
FIG. 1 shows a schematic cross-sectional side view of a portion of a circuit structure including an interconnect trench and interconnect material formed in the interconnect trench and on a surface of the substrate.

FIG. 1 illustrates a cross-sectional, schematic side view of a portion of a circuit substrate structure. Structure 100 include substrate 110 of, for example, a semiconductor material such as silicon or a semiconductor layer on an insulator such as glass. Substrate 110 includes contact point 120 on a surface thereof. In one embodiment, contact point 120 is a device on a substrate (e.g., gate or junction of a transistor, etc.) or a portion of an underlying interconnect line (e.g., a metal trench).

Overlying a superior surface of substrate 110 (as viewed) is dielectric material 130. In one embodiment, dielectric material 130 is a dielectric material having a dielectric constant less than the dielectric constant of silicon dioxide ($k_{SiO2}$=3.9), a "low k dielectric." A suitable material is, for example, carbon doped oxide (CDO). Dielectric layer 130 is deposited to a desired thickness, such as a thickness suitable to electrically insulate substrate 110 (e.g., devices on or above substrate 110) and to permit an interconnection to be formed therein.

FIG. 1 shows trench 140 formed in dielectric layer 130. Trench 140 extends, as viewed, into and/or out of the page and indicates a location for an interconnect line. A via would typically be present, though not shown in this cross-section, to contact point 120. Trench 140 and any vias formed to contact points on substrate 110 (e.g., contact point 120, etc.) may be formed, for example, through photo-lithographic patterning techniques.

FIG. 1 shows barrier layer 150 formed on a surface of dielectric layer 130 (a superior surface as viewed). Barrier layer 150 is conformally deposited on the surface and conforms to the contours of trench 140. In one embodiment, barrier layer 150 is of a material selected to inhibit the diffusion of an interconnection material (e.g., a copper material) formed in trench 140 from diffusing into dieletirc layer 130. A suitable material for barrier layer 150 includes conductive materials such as tantalum (Ta), tantalum nitride (TaN), titanium (Ti), molybdenum (Mo), and niobium (Nb). The thickness of barrier layer 150 may be suitable to inhibit diffusion of, for example, a copper interconnect. A thickness on the order of up to about 20 angstroms is suitable in one embodiment.

In one embodiment, the structure of FIG. 1 also includes seed layer 160. Seed layer 160 is suitable, for example, where an electroplating process will be used to form the interconnection. For an interconnection material of a copper material, seed layer 160 is a material that will facilitate a copper plating process (e.g., will provide a material to which copper will plate to). Representatively, seed layer 160 is a copper material deposited by chemical or physical deposition techniques. A thickness on the order of less than about 3,000 Å is suitable in one embodiment. FIG. 1 shows seed layer 160 conformally deposited on barrier layer 150 along the sidewalls and bottom of trench 140 and on barrier layer 150 outside trench 140.

FIG. 1 shows structure 100 after filling trench 140 with interconnect material 170 of, for example, a copper material (e.g., copper or a copper alloy). Suitable copper alloys include, but are not limited to, copper-tin (CuSn), copper-indium (CuIn), copper-cadmium (CuCd), copper-bismuth (CuBi), copper-rutherium (CuRu), copper-rhodium (CuRh), copper-rhenium (CuRe), and copper-tungsten (CuW). A typical introduction technique for a copper interconnection material as noted above is an electroplating process. By way of example, a typical electroplating process involves introducing a substrate (e.g., a wafer) into an aqueous solution containing metal ions, such as a copper sulfate-based solution, and reducing the ions (reducing the oxidation number) to a metallic state by applying current between a substrate with seed material (seed layer 160) and an anode of an electroplating cell in the presence of the solution. Referring to FIG. 1, interconnect material 170 is deposited on seed material 160 to fill trench 140 (and any vias formed between trench 140 and substrate 110) and on a surface of structure 100 outside trench 140 (referred to hereinafter as a field region).

Figure 2:
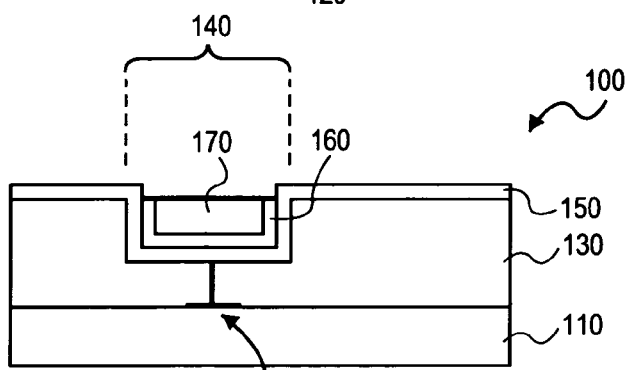
FIG. 2 shows the structure of FIG. 1 following the removal of the interconnect material from the surface of the substrate.

FIG. 2 shows the structure of FIG. 1 following the removal of interconnect material 170 from the field region (i.e., from areas outside trench 140). In the example where interconnect material 170 is copper or a copper alloy, the material in the field region may be removed by an electropolishing process. In one sense, electropolishing may be thought of as the reverse of plating. In other words, instead of depositing copper or a copper alloy as in a plating process, an electropolishing process electro-chemically dissolves the copper or copper alloy. In the example of copper or a copper alloy, an electropolishing process may be performed by polarizing structure 100 annodically in a phosphoric acid solution (e.g., a concentrated (e.g., 85 percent) phosphoric acid solution). A concentrated phosphoric acid solution is generally highly viscous which aids in the electropolishing process. Other suitable electropolishing solutions include a combination of concentrated phosphoric acid and concentrated sulfuric acid, chromic acid, or acetic acid. The electropolishing solution may also include additional additives. Suitable additives include, but are not limited to, viscosity modifiers such as glycerine; wetting agents such as polyethylene glycol or polypropylene glycol; and film-forming agents such as phosphates or poly-phosphates. In one embodiment, as part of an electropolishing process, structure 100 may be polarized with a voltage of 0.8 to 1.8 volts versus a saturated calomel electrode.

Referring to FIG. 2, the electropolishing process removes interconnect material 170 (e.g., copper material) from the field region and, in one embodiment, also partially in trench 140 to recess interconnect material 170 in trench 140. One reason to recess trench material 140 at this stage is to ensure that any interconnect material has been removed from the field region. FIG. 2 shows interconnect material 170 recessed in trench 140. FIG. 2 also shows that interconnect material 170 has been removed from the field region as has seed material 160 through the electropolishing process (e.g., particularly where a material for interconnect material 170 and seed layer 160 are similar (e.g., copper)). Thus, FIG. 2 shows barrier layer 150 exposed in the field region.

Figure 3:
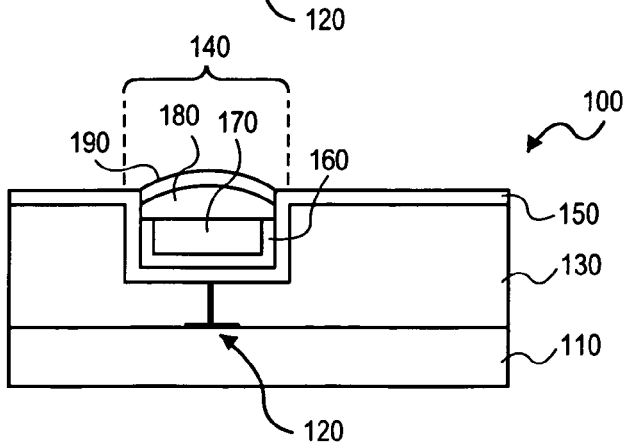
FIG. 3 shows the structure of FIG. 2 following the introduction of additional interconnect material in the trench and capping of the trench.

FIG. 3 shows the structure of FIG. 2 following the introduction of additional interconnect material in trench 140. In one embodiment, where interconnect material 170 is copper or a copper alloy, supplemental interconnect material 180 is a similar material. One way to deposit supplemental interconnect material 180 is through a chemically-induced oxidation-reduction reaction also referred to herein as electroless plating. Unlike an electroplating process, an electroless plating process is not accomplished by an externally-supplied current, but instead relies on the constituents of the plating process (e.g., constituents of a plating bath) to initiate and carry out the plating process. One technique involves placing structure 100 in a bath containing one or more metal ions to be plated or introduced onto interconnect material 170. In the case of introducing a copper or copper alloy as subsequent interconnect material 180, the copper is in an ionic state having a positive oxidation number. Representatively, copper ions may be present in a bath as copper sulfate in a concentration range of five to 10 grams per liter (g/l). As such, the copper ions are in a sense subsequent interconnect material precursors. Additional precursors to form an alloy may include, but are not limited to, tin, indium, cadmium, etc.

Without wishing to be bound by theory, it is believed that the exposed conductive surface, in this case a conductive surface of interconnect material 170, on structure 100, when exposed to the components of an electroless plating solution or bath, undergo an oxidation-reduction (REDOX) reaction. The oxidation number of the metal ions of the introduced subsequent interconnect material precursors are reduced while the oxidation number of the reducing agent(s) are increased. Suitable reducing agents therefore are included in an electroless plating bath. In one embodiment, the reducing agents are alkaline metal-free reducing agent such as formaldehyde and a pH adjuster such as tetramethyl ammonium hydroxide (TMAH). In one embodiment, a complexing agent such as ethylene diamine tetra-acetic acid (EDTA) is also present. A representative temperature of a suitable bath to electrolessly deposit copper is on the order of greater than 50° C. and a suitable pH is in the range of 10-13. As shown in FIG. 3, according to this process, the electroless deposition of subsequent interconnect material 180 may be selectively deposited in trench 140 on interconnect material 170.

Following the introduction of subsequent interconnect material 180, in one embodiment, shunt material 190 is deposited on subsequent interconnect material 180 in trench 140. In one embodiment, shunt material 190 is also deposited by an electroless plating process. Representatively, the shunt material includes cobalt or nickel, or an alloy or cobalt or nickel. Suitable cobalt alloys include, but are not limited to, cobalt-phosphorous (CoP), cobalt-boron (CoB), cobalt-phosphorous-boron COPB), cobalt-metal-phosphorous (CoMeP), cobalt-metal-boron (CoMeB), and cobalt-metal-phosphorous-boron (CoMePB). As used herein, "Me" includes, but it not limited to, nickel (Ni), copper (Cu), cadmium (Cd), zinc (Zn), gold (Au), silver (Ag), platinum (Pt), ruthenium (Ru), rhodium (Rh), palladium (Pd), chromium (Cr), molybdenum (Mo), iridium (Ir), rhenium (Re), and tungsten (W). The use of refractory metals (e.g., W, Re, Ru, Rh, Cr, Mo, Ir) tends to improve the adhesive properties of shunt material 190 as well as the mechanical hardness of shunt material 190. Combining Co and/Ni material with a noble metal (e.g., Au, Ag, Pt, Pd, Rh, Ru) allows the noble metals to act as a catalytic surface for the electroless plating on copper interconnect material such as subsequent interconnect material 180. Phosphorous (P) and boron (B) tend to be added to the shunt material as a result of reducing agent oxidation. Phosphorous and boron tend to improve the barrier and corrosion properties of the shunt material.

In terms of introducing metal ions of shunt material 180 for an electroless plating process, metal ions (shunt material precursors) of cobalt supplied by cobalt chloride, cobalt sulfate, etc., may be introduced in a concentration range, in one embodiment, of about 10-70 grams per liter (g/l), alone or with the addition of compounds containing metal ions of a desired alloy constituent (e.g., Ni, Cu, etc.). Examples of suitable additional compounds include ammonium tungstate (for alloying with W), ammonium perrhenate (for alloying with Re), etc. A suitable concentration range for the addition compound(s) include 0.1 to 10 g/l.

To reduce the oxidation number of the metal ions, one or more reducing agents are included in an electroless plating bath. In one embodiment, the reducing agents are selected to be alkaline metal-free reducing agents such as ammonium hypophosphite, dimethylamine borate (DMAB), and/or glyoxylic acid in a concentration range of about 2 to 30 g/l. The bath may also include one or more alkaline metal-free chelating agents such as citric acid, ammonium chloride, glycine, acetic acid, and/or malonic acid in a concentration range of about 5 to 70 g/l. Still further, one or more organic additives may also be included to facilitate hydrogen evolution. Suitable organic additives include Rhodafac RE-610™, cystine, Triton X-100™, polypropylene glycol/polyethylene glycol (in a molecular range of approximately 200 to 10,000) and a concentration range of about 0.01 to 5 grams per liter (g/l), an alkaline, metal-free pH adjuster such as ammonium hydroxide, tetramethyl ammonium hydroxide, tetraethyl ammonium hydroxide, tatrapropyl ammonium hydroxide, and/or tetrabutyl ammonium hydroxide, may further be included in the bath to achieve a suitable pH range, such as a pH range of 3 to 14. A representative process temperature for an electroless plating bath such as described is on the order of 30 to 90° C. The electroless plating process introduces (e.g., plates) shunt material 190 to expose conductive surfaces amenable to the plating reaction. In one embodiment, the conductive surface is limited to subsequent interconnect material 180. Prior to the plating operation, an exposed surface of subsequent conducting material 180 may be treated to improve the uniformity of the electroless plating of shunt material 190. Subsequent interconnect material 180 may be surface treated with an agent such as a 1 to 20 percent by volume hydrofluoric acid (HF), sulfuric acid ($H_2SO_4$), sulfonic acids such as methane sulfonic acid (MSA), ethane sulfonic acid (ESA), propane sulfonic acid (PSA) and/or benzene sulfonic acid (BSA) for cleaning of the interconnect material.

FIG. 3 shows an interconnect structure including interconnect material 170, subsequent interconnect material 180, and shunt material 190 as a cap or overlying structure. As a non-limiting example, shunt material 190 has a thickness on the order of 5 to 300 nanometers (nm).

In the structure described with reference to FIG. 3, barrier layer 150 remained in the field region after the electropolishing of interconnect material 170. One reason the barrier layer remained in the field region is that the electropolishing process was selective for removal of the interconnect material (e.g., selective for copper). In one embodiment, barrier layer 150 is an electrically conductive material, such as tantalum or tantalum nitride. Thus, where barrier layer 150 remains in the field region, it may be desirable to reduce or minimize the electrical conductivity of a material for barrier layer 150.

Figure 4:
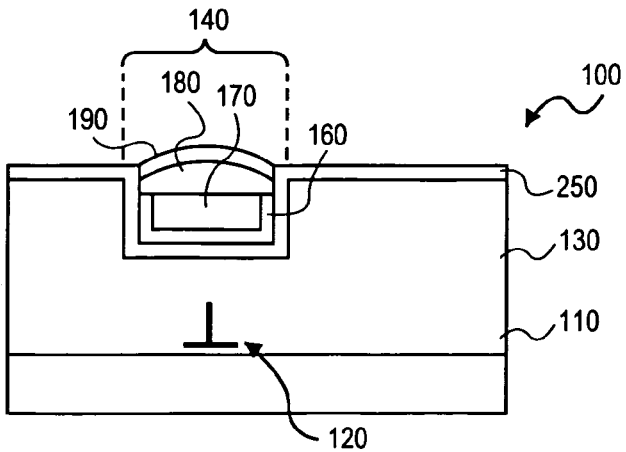
FIG. 4 shows the structure of FIG. 3 and a reduction of the electrical conductivity of the barrier material on the surface of the substrate.
Figure 5:
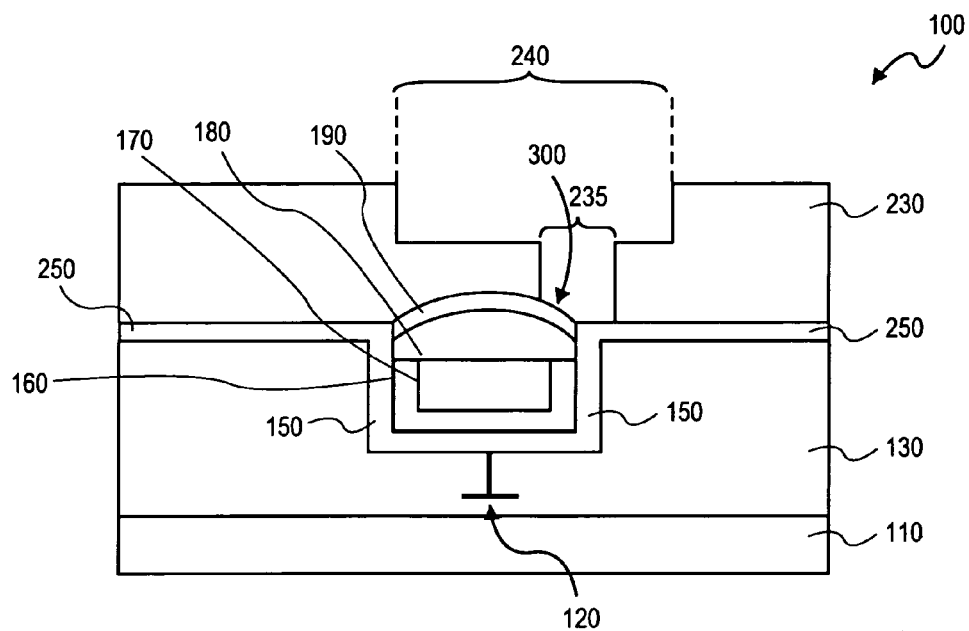
FIG. 5 shows the structure of FIG. 4 following the introduction of a subsequent dielectric layer and a trench via formed into the dielectric layer to the underlying interconnect.

FIG. 4 shows the structure of FIG. 3 following the reduction or minimization of electrical conductivity of a material for barrier layer 150 in the field region. In one embodiment, the reduction or minimization of electrical conductivity of a material for barrier layer 150 may be accomplished through an oxidation of the material. Representatively, structure 100 may be placed in an oxygen-containing environment (e.g., an oxygen plasma environment) under temperature conditions greater than, for example, 300° C. FIG. 4 shows structure 100 including barrier layer 250 of oxidized material for the barrier layer in the field region. A subsequent CMP can be introduced to planarize electroless plated shunt layer 190 and avoid topography build up in the next level interconnect structure FIG. 5 shows the structure of FIG. 4 following the introduction (e.g., deposition) of a dielectric layer on barrier layer 250 and the composite interconnect (on shunt layer 190). Representatively, dielectric layer 230 is a low k dielectric material (e.g., CDO) formed to a thickness suitable to electrically insulate the composite interconnect and allow the formation of a subsequent interconnect in the dielectric layer. FIG. 5 also shows via 235 and trench 240 formed in dielectric layer 230. Representatively, a mask, such as a photoresist mask, may be used to define an area (e.g., a cross-sectional area) for a via opening and then via 235 may be etched with a suitable chemistry. The mask may then be removed (such as by an oxygen plasma to remove photoresist) and a second mask patterned to define a greater area (e.g., a greater cross-sectional area) for a trench opening. A subsequent etch is introduced to form trench 240 and the second mask is removed leaving the structure shown in FIG. 5.

FIG. 5 shows via 235 as a partially unlanded via. In that sense, via 235 is formed through dielectric layer 230 and contacts a portion of shunt layer 190 indicated at point 300. A portion of via 235 also contacts barrier layer 250. In the embodiment where barrier layer 250 has had its electrical conductivity reduced or minimized, a partially unlanded via such as via 235 may not adversely effect the circuit (e.g., because the electrical conductivity of barrier layer 250 is reduced or minimized).

Figure 6:
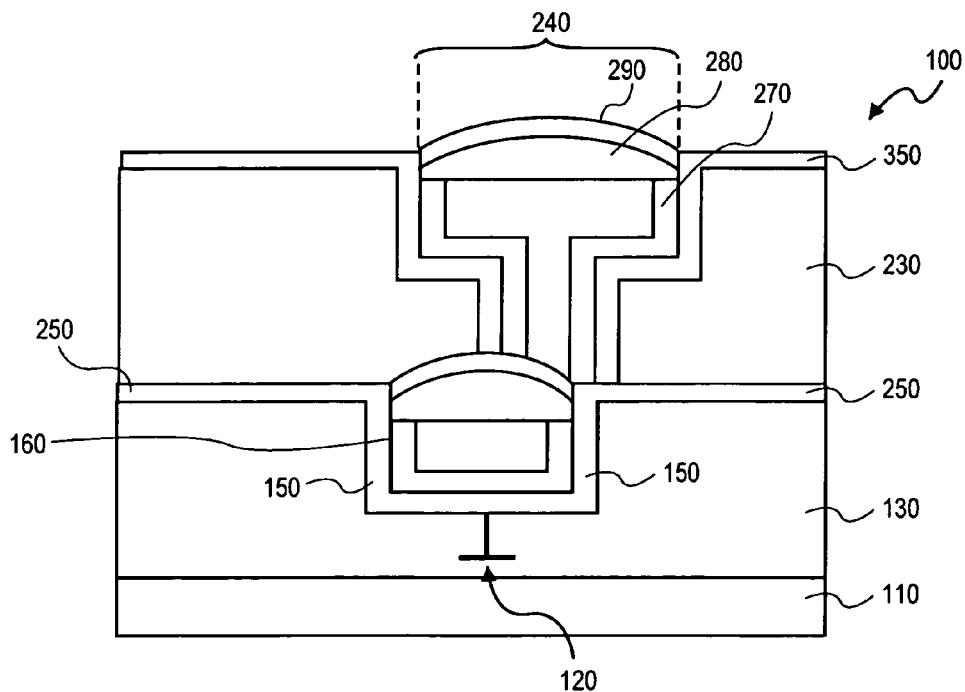
FIG. 6 shows the structure of FIG. 5 following the formation of an interconnect in the subsequent layer of dielectric.

FIG. 6 shows the structure of FIG. 5 following the formation of a, as illustrated, second level interconnect structure of a composite structure including electroplated interconnect material 270 subsequently introduced (electrolessly plated) interconnect material 280 and shunt layer 290. FIG. 6 also shows a subsequent barrier layer 350 with its electrical conductivity minimized or reduced. It is appreciated that the process described with respect to FIGS. 1-6 may be repeated for multiple interconnect levels.

In the preceding detailed description, specific embodiments were described. It will, however, be evident that various modifications and changes may be made thereto without departing from the broader spirit and scope as set forth in the claims. The specification and drawings are, accordingly, to be regarded in an illustrative rather than a restrictive sense.

What is claimed is:

1. An apparatus comprising:
a circuit substrate comprising at least one active layer including at least one contact point;
a dielectric layer on the at least one active layer with an opening to the contact point;
a barrier layer on a surface of the dielectric layer and in the opening, a first portion of the barrier layer on the surface having a first electrical conductivity that is less than a second electrical conductivity of a second portion of the barrier layer in the opening; and
an interconnect disposed in the opening through the dielectric layer and coupled to the at least one contact point, the interconnect including a recessed surface opposite the coupling to the contact point.

2. The apparatus of claim 1, wherein the dielectric layer comprises a material having a dielectric constant that is less than a dielectric constant of silicon dioxide.

3. The apparatus of claim 1, wherein a material for the first portion of the barrier layer is an oxidized form of a material for the second portion of the barrier layer.

4. The apparatus of claim 1 further comprising a cap layer on the interconnect, wherein the interconnect is defined between the cap layer and the contact point.

5. The apparatus of claim 4, wherein the cap layer extends an area limited by a surface area of the interconnect.

6. The apparatus of claim 4, wherein the cap layer comprises a refractory metal.

7. The apparatus of claim 4, wherein the cap layer comprises an alloy of one of cobalt and nickel.

8. The apparatus of claim 7, wherein the alloy comprises a noble metal.

9. The apparatus of claim 4, wherein the cap layer comprises one of boron and phosphorous.

10. The apparatus of claim 1, wherein the dielectric layer comprises a first dielectric layer, the apparatus further comprising at least a second dielectric layer formed on the first dielectric layer.

11. The apparatus of claim 1 further comprising:
an electroless plate of a first conductive material on the recessed surface; and
an electroless plate of a second conductive material on the first material.

12. The apparatus of claim 10 wherein the interconnect comprises a third material and the first material is the same as the third material; and wherein the second material comprises cobalt or nickel.

* * * * *